United States Patent [19]

Beasom

[11] Patent Number: 4,532,003
[45] Date of Patent: Jul. 30, 1985

[54] METHOD OF FABRICATION BIPOLAR TRANSISTOR WITH IMPROVED BASE COLLECTOR BREAKDOWN VOLTAGE AND COLLECTOR SERIES RESISTANCE

[75] Inventor: James D. Beasom, Melbourne, Fla.

[73] Assignee: Harris Corporation, Melbourne, Fla.

[21] Appl. No.: 406,333

[22] Filed: Aug. 9, 1982

[51] Int. Cl.³ .................. H01L 21/306; H01L 7/44; H01L 29/72; H01L 7/00
[52] U.S. Cl. .................. 156/648; 29/576 W; 29/580; 148/187; 148/190; 156/653; 156/657; 156/659.1; 156/662; 357/34; 357/49; 427/85; 427/86
[58] Field of Search .............. 29/576 W, 578, 580, 29/583; 156/647, 648, 649, 651, 653, 657, 659.1, 662; 427/85, 86, 88, 93; 357/34, 49, 63; 148/1.5, 187, 190

[56] References Cited

U.S. PATENT DOCUMENTS

| | | | |
|---|---|---|---|
| 3,484,308 | 12/1969 | Lesk | 148/33.5 |
| 3,722,079 | 3/1973 | Beasom | 29/578 |
| 3,814,997 | 6/1974 | Takahashi et al. | 357/58 |
| 3,909,119 | 9/1975 | Wolley | 357/13 |
| 4,290,831 | 9/1981 | Ports | 148/187 |

Primary Examiner—William A. Powell
Attorney, Agent, or Firm—Barnes & Thornburg

[57] ABSTRACT

A bipolar transistor having a first and second selective collector region extending from a buried high impurity region to the surface of the substrate. The first selective region defines the plane breakdown voltage to be equivalent to the planar breakdown voltage of the base-collector junction and the selective regions and the buried layer form a low series resistance collector.

24 Claims, 13 Drawing Figures

METHOD OF FABRICATION BIPOLAR TRANSISTOR WITH IMPROVED BASE COLLECTOR BREAKDOWN VOLTAGE AND COLLECTOR SERIES RESISTANCE

BACKGROUND OF THE INVENTION

A well-known characteristic of planar PN junctions is the reduction of breakdown voltage compared to that of a plane junction of the same profile due to field concentration at the junction periphery where the diffused layer curves up to the surface. A number of methods such as diffused field relief rings, junction termination extensions and field plates have been employed to make the planar breakdown of the simple geometry more nearly approach the planar breakdown for the profile in question. While these methods do increase the breakdown voltage, they require substantial die area and precise control of the substrate doping. Typical examples of these prior art methods are illustrated in U.S. Pat. No. 3,909,119 to Wolley. This patent also shows the use of a low impurity concentration substrate with an increased impurity concentration region of a first conductivity type being buried below an optimum impurity concentration of an opposite conductivity type so as to produce the desired value of plane breakdown which is lower than the planar breakdown of the original substrate. Other examples of using this concept for diodes is illustrated in U.S. Pat. No. 3,484,308 to Lesk and U.S. Pat. No. 3,814,997 to Takahashi et al.

While these patents provide an improvement over prior art diodes, they do not address the problem of forming bipolar transistors in integrated circuits with all the contacts on the top surface. The prior art cited above are discrete devices which make contact to the bottom of the PN junction by the bottom of the substrate and, thus, does not address the problem of low contact resistance in combination with the improved plane breakdown voltages. Since they are designed for plane breakdown voltage optimization, they are not directed to reducing collector resistance with possible planar breakdown. Thus, there exists the need for an improved bipolar transistor having low collector series resistance and improved planar collector-to-base breakdown voltage.

SUMMARY OF THE INVENTION

An object of the present invention is to provide a bipolar transistor having improved collector-to-base breakdown voltage.

Another object of the present invention is to provide a method of fabricating a bipolar transistor having a predictable collector-to-base breakdown voltage.

An even further object of the present invention is to provide a bipolar transistor having improved collector-to-base breakdown voltage and reduced collector series resistance in integrated circuits.

A still even further object of the present invention is to provide a method of forming top contact low collector series resistance.

These and other objects of the present invention are attained by forming a first selective region of the collector having a smaller lateral area than the base region between the base region and a buried region of the same conductivity type as the selective region and a second selective region extending from the buried region to the surface to provide the uniform planar breakdown voltage and low collector series resistance. These selective regions may have a graded impurity concentration decreasing from the buried layer to the base region and the surface of the substrate to provide a plane breakdown voltage substantially equal to the planar breakdown voltage between the base and the substrate. A collector contact region is formed in the second selective region at the top surface to minimize contact resistance. Where the substrate region is the same conductivity type as the selective regions, the minimum impurity concentration of the selective region at the base is greater than the impurity concentration of the substrate. In a second embodiment, the substrate conductivity type may be opposite that of the selective regions. For this embodiment, the second selective region encompasses the base, the collector contact region is totally within the surface of the second selective region, the buried layer if selective extends laterally into but not beyond the second selective region and the emitter is above the first selective region.

A process for forming the improved bipolar transistor includes forming the first and second selective regions by introducing impurities from the backside of a substrate followed by forming a buried layer region on the bottom surface of the substrate. The bottom surface is etched, lined with a dielectric isolation and covered with a polycrystalline support structure. The opposite surface is lapped back to form dielectrically isolated regions having the buried layer and selective regions therein. Processing on the top surface continued to form the base region over one of the selective regions, an emitter region in the base region and an increased impurity concentration in the second selective layer.

Where it is desirable to have a reduced collector series resistance irrespective of the uniformity of the breakdown voltage of this base collector junction, the first and second selective regions may be formed to extend over a substantial portion of the substrate between the buried layer and the base or top surface respectively. In one application, the first and second selective regions extend from the buried layer but terminate short of the base. This structure may be produced by diffusion up from the bottom surface. In another application, the first and second selective regions may be formed from the top surface and extend down from the top surface and the base, respectively, but not intersect the buried layer.

Other objects, advantages and novel features of the present invention will become apparent upon review of the detailed description of the preferred embodiments in conjunction with the accompanying drawings.

DESCRIPTION OF THE PREFERRED EMBODIMENTS

Figure 1:
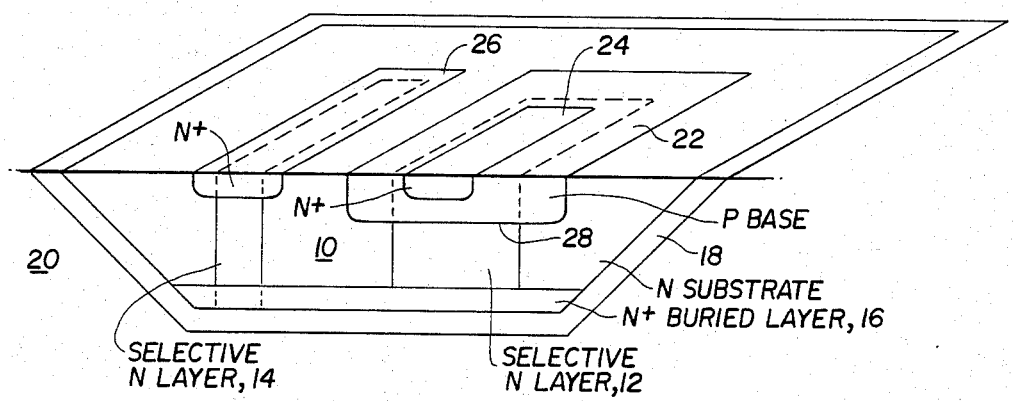
FIG. 1 is a cross-sectional perspective view of a bipolar transistor incorporating the principles of the present invention.

An NPN bipolar transistor incorporating the principles of the present invention is illustrated in FIG. 1 as including a substrate 10 having a first and second selective N-type regions 12 and 14 formed therein and a buried N+ layer 16. The substrate 10 is surrounded on the bottom and the lateral edges by a layer of dielectric isolation 18 and supported in a body of polycrystalline material 20. This is part of an overall dielectrically isolated integrated circuit. A P-type base region 22 is formed over the first selective region 12 and has a greater lateral area than the selective region 12. An N+ emitter region 24 is formed in the base 22 and an N+ collector contact region 26 is formed in the surface of the N-type selective region 14. The PN junction between the base 22 and the first N-type selective region 12 is a plane region 28 buried below the surface of the substrate 10.

The N substrate 10 has a bulk resistance of in the range of 1 to 100 ohm-centimeters and an impurity concentration of $2 \times 10^{14}$ atoms per centimeter with the N+ buried layer having an impurity concentration in the range of $1 \times 10^{18}$ to $5 \times 10^{20}$ atoms per cubic centimeter. The selective N-type regions 12 and 14 may have a graded impurity concentration decreasing from the juncture with the N+ buried layer 16 to the surface of the substrate 10. The impurity concentration at the juncture with the buried N+ layer 16 in the range of $1 \times 10^{15}$ to $1 \times 10^{17}$ atoms per cubic centimeter and could decrease to a concentration in the range of $5 \times 10^{14}$ to $5 \times 10^{16}$ atoms per cubic centimeter at the surface of the substrate.

The impurity concentration of the selected areas 12 at the juncture 28 between the selective N region and the base P is most important. This is the region which defines the voltage breakdown characteristic of the collector-to-base junction. Preferably, the impurity concentration of the first selective N region 12 is in the range of $1 \times 10^{15}$ to $1 \times 10^{17}$ atoms per cubic centimeter and the P base region has a surface impurity concentration in the range of $1 \times 10^{18}$ to $5 \times 10^{19}$ atoms per cubic centimeter. The minimum impurity concentration of the selective regions 12 and 14 is generally greater than the impurity concentration of the substrate 10. By appropriate selection of the impurity concentration of the selective region 12 and the substrate 10, the plane breakdown voltage at intersection 28 and the planar breakdown voltage between the substrate 10 and the base region 22 would occur substantially simultaneously. Depending upon the depth of the base region and its radius of curvature at its edges, the impurity concentration of the first selective region at juncture 28 could be as much as four times the impurity concentration of the substrate.

The collector series resistance between collector contact 26 and the base region 22 includes the heavily doped contact region 26, the selective region 14, the heavily doped buried region 16 and the first selective region 12. This top contact, low series resistance collector path substantially reduces the resistance and improves characteristics of the device. The emitter region 24 is formed above the first selected region 12 so that a majority of the current flows into the first selective region 12 which aids the reduction of the collector series resistance. By using a graded impurity concentration of the selective regions 12 and 14, the impurity concentration of the buried selective region 12 at the intersection 28 with the base region 22 may be selected so that the breakdown of the plane region as well as the planar region occurs substantially simultaneous while the remainder of the collector has a reduced series resistance. This allows for the use of a low collector series resistance in combination with a more predictable planar breakdown structure which was previously unavailable in the prior art. By using the selective region 12, the specific impurity profile at the plane portion of the base region is specifically designed and controlled. Thus, this design offers substantial versatility over the prior art discussed in the Background of the Invention wherein the impurity concentration of a selective type region 12 is sufficiently greater than the substrate 10 so that the plane breakdown voltage at the juncture 28 occurs substantially before the planar breakdown voltage between the base 22 and the remainder of the substrate 10.

Figure 2:
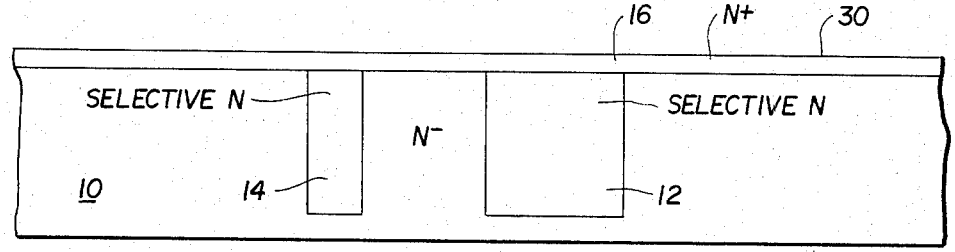
FIGS. 2-5 are cross-sectional views illustrating the method of fabricating the bipolar transistor of FIG. 1.
Figure 3:
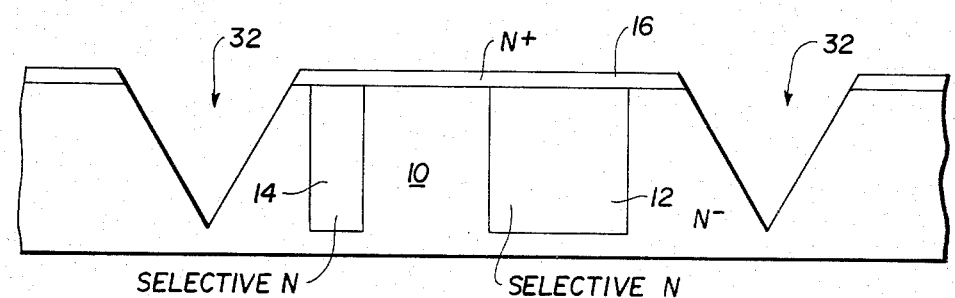

The process for forming the bipolar transistor of FIG. 1 is illustrated in FIGS. 2–5. The starting material of substrate 10 is an N-type monocrystalline silicon having a resistivity on the order of 20 ohm-centimeters. A masking layer, for example, silicon dioxide is formed on the surface 30 and is patterned to form openings for the to-be-formed selective regions 12 and 14. N-type impurities, for example, phosphorus are deposited and diffused to form the first and second selected graded impurity regions 12 and 14. The impurities may be deposited by deposition or ion implantation and diffused in a heating cycle for a period of 25 to 250 hours to form the graded impurity region. The masking layer is removed and a non-select doping step is performed using N-type impurities, for example, arsenic, to form an N+ layer 16 along the top surface 30. The wafer at this stage of development is illustrated in FIG. 2.

Figure 4:
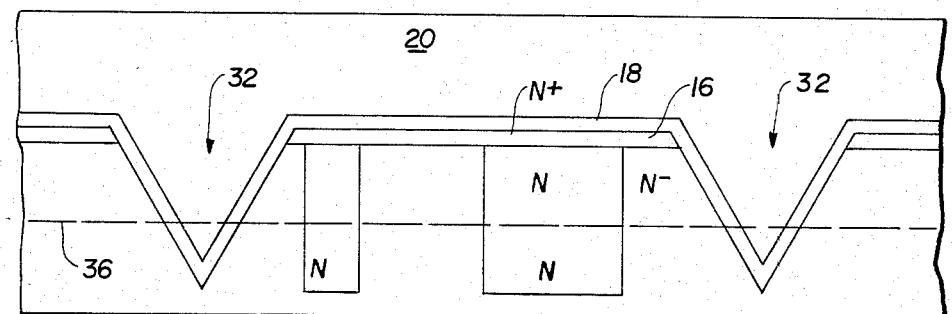

The formation of the dielectric isolation begins by forming a masking layer and selectively etching the moats 32 in the substrate 10. A dielectric layer 18 is formed on the surface 10 and moats 32. The dielectric layer 18 may be an oxide formed by thermal oxidation. This followed by the formation of the support layer 20 which is polycrystalline silicon grown over the isolation oxide layer 18. The wafer at this stage of fabrication is illustrated in FIG. 4.

Figure 5:
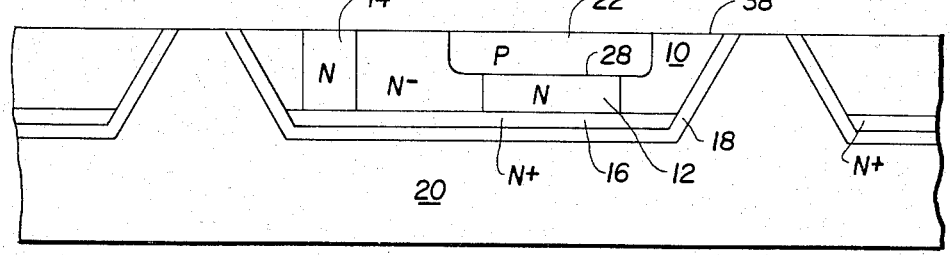

After the support layer 20 is formed, the substrate 10 is backlapped along surface 34 to remove all the material down to the dotted line 36. This forms dielectrically isolated islands as illustrated in FIG. 5. A masking layer is provided on the new surface 38 and is to provide openings for the base regions to be formed. P-type impurities, for example, boron are deposited and diffused to form the base regions 22. The base region 22 have a greater lateral area than the first selective N-type region such that their intersection or juncture 28 is buried below the surface 38 of the substrate. Another mask is formed on the surface 38 and N-type impurities, for example, phosphorus, are deposited and diffused to form the emitter region 24 in the base regions 22 and the collector contact region 26 on the surface of the second selective N-type layer 14. Since the selective N-type region 14 is a graded region, the N+ collector contact region 26 is greater than $5 \times 10^{19}$ atoms per cubic centimeter to insure an ohmic contact to this region. The resulting structure is that of FIG. 1.

Although the selective N-type regions 12 and 14 and buried N+ region are shown being formed before the etching of the moats, they may be formed after the etching of the moats. It is desirable to form them before the etching of the moats since the formation of the masking layers is simpler with no moats involved. Also, the buried N+ region may be formed selectively by masking instead of non-selectively.

Although the process of FIGS. 2-5 have been described in detail to show the formation of the NPN bipolar transistor of FIG. 1, the conductivity types may be reversed to form a PNP bipolar transistor in a P-type substrate having buried P+ region and selective P-type collector regions.

The formation of the graded selective regions 12 and 14 have been described as being formed by deposition and diffusion, but they also can be formed by other methods. To be more specific, the substrate 10 may be etched to form openings in the substrate and then are filled by epitaxial deposition. The impurity concentration during the epitaxial deposition will be varied to form the graded regions. This etching and refill may be performed prior to the formation of the dielectric isolation, as were the diffused selective regions, from the backside or after the formation of the dielectrically isolated regions from the front side. Although the bipolar transistor has been illustrated as being formed in dielectrically isolated islands, the principles are also applicable to junction isolated integrated circuits.

Figure 6:
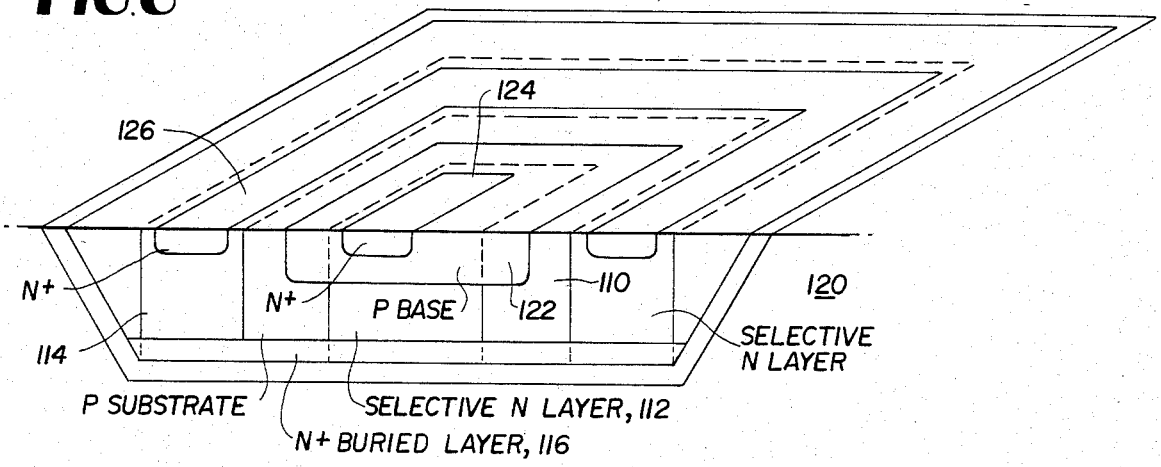
FIG. 6 is a cross-sectional perspective view of another embodiment of a bipolar transistor incorporating the principles of the present invention.

Another embodiment of a bipolar transistor of the present invention is illustrated in FIG. 6. The major difference of the NPN bipolar transistor of FIG. 6 versus FIG. 1 is that the substrate region is of a different conductivity type than the selective regions and the buried layer. The bipolar transistor includes a P substrate 100 having an N+ buried layer 116 and N-type selective regions 112 and 114 therein. It should be noted that since regions 114 are formed in a substrate of the opposite conductivity type, it is formed as a ring encompassing the P+ base region 122. The P base region 122 is formed over the first N-type selective region 112 and has a greater lateral area than the first selective N-type region 112. The surface impurity concentration of the base region 122 is $5 \times 10^{18}$ atoms per cubic centimeter. An N+ emitter region 124 is formed in the base region 122 entirely above the first selective region 112 and N+ collector contact region 126 is formed in the second selective N-type region 114. Since the collector contact region 126 is of an opposite conductivity type from the P-type substrate, the lateral area of the collector contact region 126 is formed within the second selective region 114 and, thus, also differs from that of FIG. 1. The requirements and operation of the bipolar transistor of FIG. 6 is the same as that of FIG. 1 wherein the selective N-type regions of the collector are formed so as to define the specific breakdown voltage between the base and collector region as well as providing a low contact series resistance for a top contact collector region.

Figure 7:
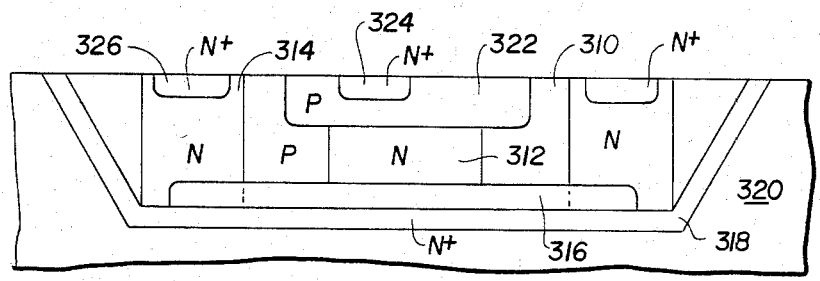
FIG. 7 is a cross-sectional view of a bipolar transistor similar to FIG. 6 having a selective buried layer.

As with the bipolar transistor of FIG. 1, the bipolar transistor of FIG. 6 may be formed as a PNP transistor by reversing all the conductivity types such that the PNP transistor is formed in an N-type substrate.

Where the buried region is formed selectively and does not extend to the dielectric insulation and the substrate is of the opposite conductivity type, the buried layer will have a curved portion which could form a low breakdown voltage region with the substrate. To prevent this undesirable result, the selective buried layer should extend and terminate within the second selective region which encompasses the base. This is specifically illustrated in FIG. 7 where the buried N+ layer 316 terminates within the second selective N region 314.

Figure 8:
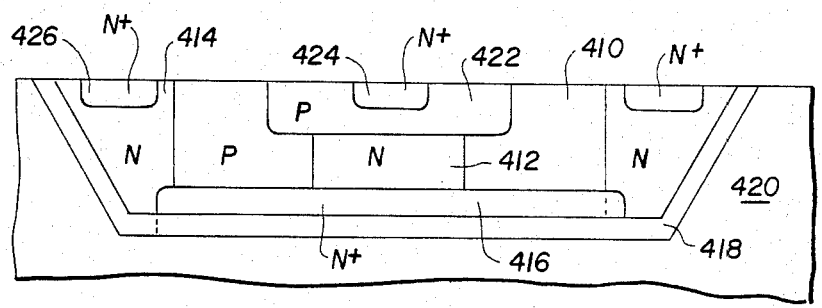
FIG. 8 is a cross-sectional view of a further modification of the bipolar transistor of FIG. 6.

In some applications, the second selective region may invert and create a conduction path to the substrate beyond the second selective region. To prevent these undesirable results, the second selective region can be extended laterally to the edge of the insulation to eliminate any substrate region beyond the second selective region. This is illustrated in FIG. 8 wherein the second selective region 414 extends laterally to the dielectric layer 418. By forming the collector contact 426 as a ring, it will also inhibit the inversion of the surface of the second selective region 414.

Figure 9:
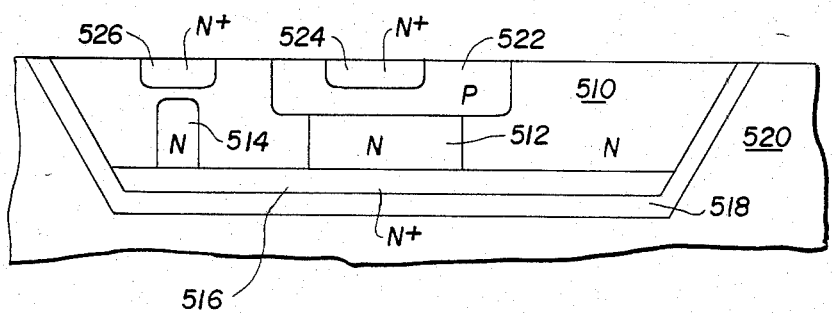
FIG. 9 is a cross-sectional view of a modification of the bipolar transistor of FIG. 1.

Since the impurity concentration of the collector region adjacent the base determines the plane breakdown voltage, the first and second selective regions 12 and 14 need not extend from the buried region 16 to the surface of the substrate 310 as long as they extend to the base where the substrate is of the same conductivity type as the selective and buried regions. The surface collector contact, the buried layer and the first and second selective regions, even if they do not all intersect, will substantially reduce the collector series resistance. FIG. 9 illustrates a bipolar transistor where the second selective regions 514 extends from the buried region 516 and terminates short of the top collector contact 526 without intersecting the same. The first selective region 512 extends between and intersects the base region 522 and the buried region 516 to define a plane breakdown voltage equivalent to the planar breakdown voltage. Since the buried region 516 is formed from arsenic and the selective regions 512 and 514 of phosphorus, the impurities of these three regions may be applied and then diffused simultaneously. The different diffusion constants of these two impurities will result in the different depth regions of FIG. 9 for the same diffusion period.

Figure 10:
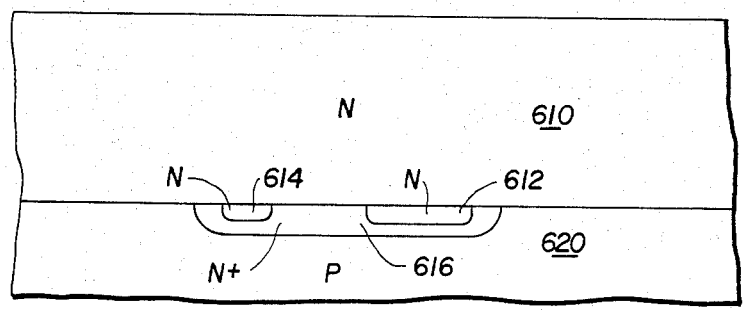
FIGS. 10–12 are cross-sectional views illustrating the method of fabricating a low collector series resistance bipolar transistor in junction isolation incorporating the principles of the present invention.
Figure 11:
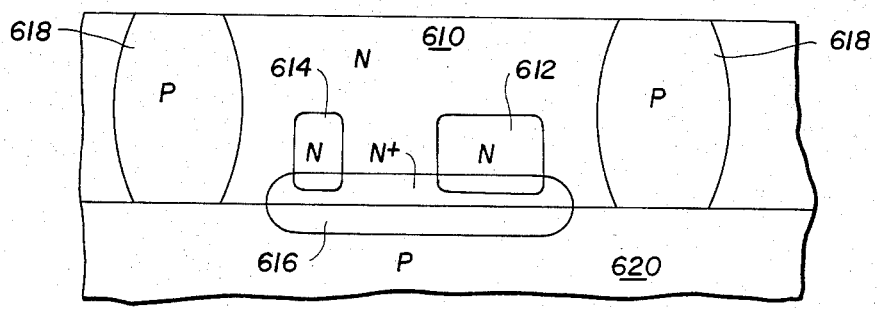
Figure 12:
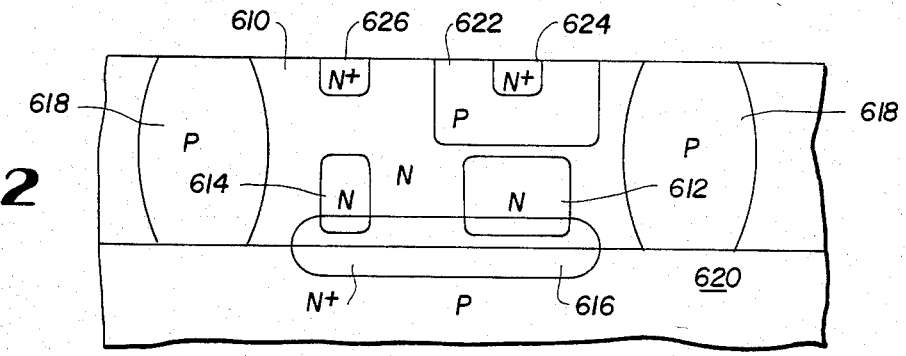

The application of this process to junction isolation is illustrated in FIGS. 10 through 12. N type impurities, for example, arsenic, are introduced into region 616 of a P support 620 and N type impurities, for example, phosphorus, are introduced into regions 612 and 614 of the P support 620. The introduction may be by ion implantation preferably, but can also be by deposition. An N layer 610 is epitaxially deposited on the P support 620.

P type impurities, for example, boron, are introduced in the surface of the epitaxial layer 610. The structure is subjected to a diffusion step which results in forming junction isolation regions 618, a buried N+ region 616 and first and second selective N regions 612 and 614, respectively. The structure is illustrated in FIG. 11.

P type impurities, for example, boron, are introduced above the first selective N region 612 and diffused to form the base region 622. N type impurities, for example, phosphorus are introduced in the base region 622 above the first selective regions 612 and in the epitaxial layer 610 above the second selective region 614 and diffused to form emitter 624 and collector contact 626. The resulting structure is illustrated in FIG. 12.

Because of the design and diffusion time limitation of junction isolation, the first and second selective regions 612 and 614 do not out diffuse sufficiently to intersect the base region 622 or the collector contact 626, respectively. Their occupation of a substantial portion of the area of the epitaxial layer below the emitter 624 and the collector contact 626 substantially reduces the collector series resistance. Since the selective region 612 does not intersect the base region 622 and, thus, has little effect on the breakdown voltage, it can be than a substantially greater impurity concentration of the epitaxial layer 610.

Figure 13:
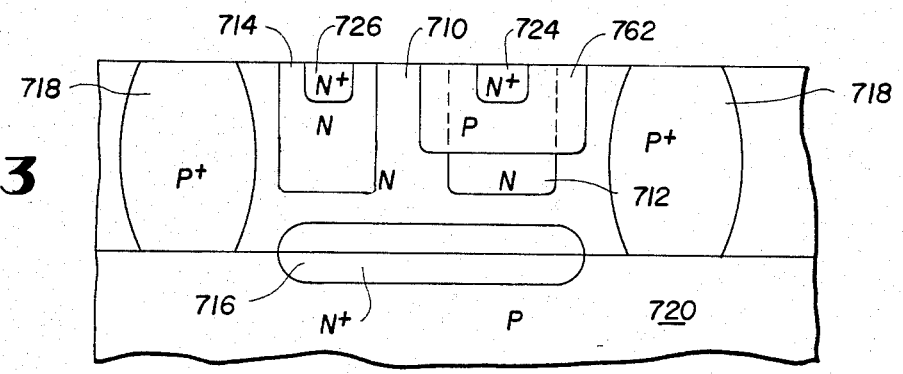
FIG. 13 is a cross-sectional view of another embodiment of a low collector series resistance bipolar transistor in junction isolation.

Alternatively, the first and second selective regions may be formed by introduction of impurities into the top surface of the epitaxial layer and diffused down simultaneously with the down diffusion of the junction isolation regions and the up diffusion of the buried layer. This will produce selective regions which extend from the top collector contact and the base region without intersecting the buried region. This structure is illustrated in FIG. 13.

Although the principles of the present invention have been described and illustrated for both dielectric and junction isolations, they are also applicable to other isolated structures. One example is polyplanar where the bottom of the collector region is isolated by junction isolation between a buried N+ region and a P support and the lateral edges of the collector are isolated by dielectric isolation and polycrystalline material.

From the preceding description of the preferred embodiments, it is evident that the objects of the invention are attained. Although the invention has been described and illustrated in detail, it is to be clearly understood that the same is by way of illustration and example only and is not to be taken by way of limitation. The spirit and scope of the present invention are limited only by the terms of the appended claims.

What is claimed is:

1. A method of fabricating a vertical bipolar transistor comprising:
   simultaneously forming in a substrate of a first conductivity type a first and second selective region of said first conductivity type extending from the bottom toward the top surface of said substrate and having an impurity concentration greater than said substrate;
   forming in the bottom of said substrate a buried region of said first conductivity type and having an impurity concentration greater than said substrate;
   forming a base region of a second conductivity type opposite said first conductivity in said substrate over said first selective region, said base region having a greater lateral area than said first selective region to form a buried junction therewith, the impurity concentration of said first selective region at said buried junction being sufficiently greater than said first impurity concentration of said substrate to produce a plane breakdown voltage equivalent to the planar breakdown voltage;
   forming an emitter region in said base region of said first conductivity type; and
   forming a collector contact region in the surface of said second selective region of said first conductivity type and having an impurity concentration greater than said second selective region.

2. The method according to claim 1, wherein said first and second selective regions are formed by diffusing impurities in from the back of the substrate toward said surface to form graded selective regions decreasing toward the top surface.

3. The method according to claim 1, wherein said first and second selective regions are formed by etching said substrate to form first and second openings and epitaxially filling said openings while varying the impurity concentration to form a graded selective region decreasing from the buried region.

4. The method according to claim 1, wherein the impurity concentration of said first selective region adjacent the base is formed to be up to four times the impurity concentration of the substrate.

5. The method according to claim 1, wherein said emitter region is formed above said first selective region and has a smaller lateral area than said first selective region.

6. The method according to claim 1, wherein said emitter region and said collector contact region are formed simultaneously.

7. A method of fabricating a vertical bipolar transistor comprising:
   forming in a substrate of a first conductivity type a first and second selective region of a second conductivity type opposite said first conductivity type extending up from the bottom of said substrate buried region toward the surface of said substrate;
   forming in the bottom of said substrate a buried region of said second conductivity type;
   forming a base region of said first conductivity in said substrate over said first selective region, said base region having a greater lateral area than said first selective region to form a buried junction therewith, the impurity concentration of said base region being greater than said first impurity concentration of said substrate;
   forming an emitter region in said base region of said second conductivity type; and
   forming a collector contact region in the surface of said second selective region of said second conductivity type and having an impurity concentration greater than said second selective region.

8. The method according to claim 7, wherein said first and second selective regions are formed by diffusing impurities in from the back of the substrate toward said surface to form a graded region decreasing toward the top surface.

9. The method according to claim 7, wherein said first and second selective regions are formed by etching said substrate to form first and second openings and epitaxially filling said openings while varying the impurity concentration to form graded selective regions decreasing from said buried region.

10. The method according to claim 7, wherein the impurity concentration of said first selective region decreases from the buried region to said base region.

11. The method according to claim 7, wherein said emitter region is formed above said first selective region and has a smaller lateral area than said first selective region.

12. The method according to claim 7, wherein said emitter region and said collector contact region are formed simultaneously.

13. The method according to claim 7, wherein said second selective region is formed as a ring spaced from and encompassing said base region.

14. The method according to claim 13, wherein said buried region is formed with its lateral edges terminating within said second selective region.

15. The method according to claim 13, wherein said collector contact region has a smaller lateral area than said second selective region and is encompassed by said second selective region.

16. A method of fabricating a vertical bipolar transistor comprising:

simultaneously forming in a substrate of a first conductivity type a first and second selective region of said first conductivity type extending from the bottom of said substrate substantially to the surface of said substrate and having an impurity concentration greater than said substrate;

forming in the bottom of said substrate intersecting said first and second selective regions a buried region of said first conductivity type and having an impurity concentration greater than said substrate;

forming a base region of a second conductivity type opposite said first conductivity type in the surface of said substrate over said first selective region and terminating short of said first selective region, said base region having a greater lateral area than said first selective region;

forming an emitter region of said first conductivity type in said base region above said first selective region and having a lateral area less than the lateral area of said first selective region;

forming a collector contact region of said first conductivity type in the surface of said substrate above said second selective region and terminating short of said second selective region and having an impurity concentration greater than said second selective region.

17. The method according to claim 16, wherein said buried region and said first and second regions are formed by simultaneously diffusing into the bottom of said substrate a first impurity to form said buried layer and a second impurity having a greater diffusion constant than said first impurity to form said first and second selective regions.

18. A method of fabricating a vertical bipolar transistor comprising:

forming in the bottom of a substrate of a first conductivity type a buried region of said first conductivity type and having a greater impurity concentration than said substrate;

simultaneously forming in the surface of said substrate a first and second selective region of said first conductivity type and having an impurity concentration higher than said substrate and extending substantially to and terminating short of said buried region;

forming a base region of a second conductivity type opposite said first conductivity type in the surface of said substrate over said first selective region, said base region having a greater lateral area than said first selective region;

forming an emitter region of said first conductivity type in said base region above said first selective region and having a lateral area less than the lateral area of said first selective region;

forming a collector contact region in the surface of said second selective region of said first conductivity type and having an impurity concentration greater than said second selective region.

19. A method of fabricating a vertical bipolar transistor comprising:

simultaneously forming, in a substrate of a first conductivity type, a first and second selective region of said first conductivity type extending from the bottom toward to the top surface of said substrate and having an impurity concentration greater than said substrate;

forming a base region of a second conductivity type opposite said first conductivity type in said substrate over said first selective region, said base region having a greater lateral area than said first selective region to form a buried junction therewith, the impurity concentration of said first selective region at said buried junction being sufficiently greater than said first impurity concentration of said substrate to produce a plane breakdown voltage equivalent to the planar breakdown voltage; and forming an emitter region in said base region of said first conductivity type.

20. A method according to claim 19 including forming in the bottom of said substrate a buried region of said first conductivity type extending laterally between said first and second selective regions and having an impurity concentration greater than said substrate.

21. A method according to claim 19 including forming a collector contact region in the surface of said second selective region of said first conductivity type and having an impurity concentration greater than said second selective region.

22. A method of fabricating a vertical bipolar transistor comprising:

simultaneously forming, in a substrate of a first conductivity type, a first and second selective region of said first conductivity type extending from a bottom region of said substrate, having a first conductivity type and impurity concentration greater than said substrate, substantially to the top surface of said substrate and having an impurity concentration greater than said substrate;

forming a base region of a second conductivity type opposite said first conductivity type in the surface of said substrate over said first selective region and terminating short of said first selective region, said base region having a greater lateral area than said first selective region; and forming an emitter region of said first conductivity type in said base region above said first selective region and having a lateral area less than the lateral area of said first selective region.

23. A method according to claim 22 including forming a collector contact region of said first conductivity type in the surface of said substrate above said second selective region and terminating short of said second selective region and having an impurity concentration greater than said second selective region.

24. A method of fabricating a vertical bipolar transistor comprising:

forming in the bottom of a substrate of a first conductivity type a buried region of said first conductivity type and having a greater impurity concentration than said substrate;

simultaneously forming in the top surface of said substrate a first and second selective region of said first conductivity type and having an impurity concentration higher than said substrate and extending substantially to and terminating short of said buried region;

forming a base region of a second conductivity type opposite said first conductivity type in the surface of said substrate over said first selective region, said base region having a greater lateral area than said first selective region; and forming an emitter region of said first conductivity type in said base region above said first selective region and having a lateral area less than the lateral area of said first selective region.

* * * * *